(12) United States Patent
Miyata

(10) Patent No.: US 7,635,650 B2
(45) Date of Patent: Dec. 22, 2009

(54) PREVENTION OF PLASMA INDUCED DAMAGE ARISING FROM ETCHING OF CRACK STOP TRENCHES IN MULTI-LAYERED LOW-K SEMICONDUCTOR DEVICES

(75) Inventor: Koji Miyata, Mahopac, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 289 days.

(21) Appl. No.: 11/404,738

(22) Filed: Apr. 14, 2006

(65) Prior Publication Data

US 2007/0243490 A1 Oct. 18, 2007

(51) Int. Cl.
*H01L 21/302* (2006.01)

(52) U.S. Cl. .................. 438/740; 438/700; 438/706; 438/741

(58) Field of Classification Search ............. 438/700, 438/706, 710, 712, 714, 618, 622, 740, 741
See application file for complete search history.

(56) References Cited

U.S. PATENT DOCUMENTS

| | | | |
|---|---|---|---|
| 5,963,412 A | 10/1999 | En | 361/111 |
| 6,403,464 B1 | 6/2002 | Chang | 438/623 |
| 6,436,808 B1 | 8/2002 | Ngo et al. | 438/623 |
| 6,669,807 B2 | 12/2003 | Nakatani | 156/345.1 |
| 6,703,641 B2 | 3/2004 | Kane et al. | 257/48 |
| 6,719,918 B2 | 4/2004 | Lee et al. | 216/79 |
| 6,770,570 B2 * | 8/2004 | Li et al. | 438/766 |
| 6,900,136 B2 | 5/2005 | Chung et al. | 438/706 |
| 7,351,635 B2 * | 4/2008 | Han et al. | 438/253 |
| 2001/0026849 A1 | 10/2001 | Yau et al. | 427/569 |
| 2002/0125577 A1 | 9/2002 | Komada | 257/774 |
| 2003/0155655 A1 | 8/2003 | Fitzsimmons et al. | 257/774 |
| 2004/0183202 A1 | 9/2004 | Usami | 257/762 |

* cited by examiner

*Primary Examiner*—Lan Vinh
(74) *Attorney, Agent, or Firm*—Mayer & Williams PC; Stuart H. Mayer, Esq.; Karin L. Williams, Esq.

(57) ABSTRACT

A method of fabricating a semiconductor device begins by forming a lower interconnection dielectric on a substrate and forming at least one active or passive device in the lower interconnection dielectric. An etch stop layer is formed on the lower interconnection dielectric and an interconnect stack layer is formed on the etch stop layer. At least one interconnect trench structure and at least one crack stop trench are etched in the interconnect stack layer while maintaining electrical isolation between the interconnect structure and the crack stop trench.

11 Claims, 6 Drawing Sheets

PREVENTION OF PLASMA INDUCED DAMAGE ARISING FROM ETCHING OF CRACK STOP TRENCHES IN MULTI-LAYERED LOW-K SEMICONDUCTOR DEVICES

FIELD OF THE INVENTION

The present invention relates generally to dual damascene interconnections for integrated circuits, and more specifically to a dual damascene interconnection having a low k layer with trenches to prevent cracking.

BACKGROUND OF THE INVENTION

The manufacture of integrated circuits in a semiconductor device involves the formation of a sequence of layers that contain metal wiring. Metal interconnects and vias which form horizontal and vertical connections in the device are separated by insulating layers or inter-level dielectric layers (ILDs) to electrically isolate wires from each other and to prevent crosstalk between the metal wiring that can degrade device performance. A popular method of forming an interconnect structure is a dual damascene process in which vias and trenches are filled with metal in the same step to create multi-level, high density metal interconnections needed for advanced high performance integrated circuits. The most frequently used approach is a via first process in which a via is formed in a dielectric layer and then a trench is formed above the via. Recent achievements in dual damascene processing include lowering the resistivity of the metal interconnect by switching from aluminum to copper, decreasing the size of the vias and trenches with improved lithographic materials and processes to improve speed and performance, and reducing the dielectric constant (k) of insulators or ILDs by using so-called low k materials to avoid capacitance coupling between the metal interconnects. The expression "low-k" material has evolved to characterize materials with a dielectric constant less than about 3.9. One class of low-k material that have been explored are organic low-k materials, typically having a dielectric constant of about 2.0 to about 3.8, which may offer promise for use as an ILD.

One difficulty that arises when the dielectric layers are formed from low-k materials is that the reduced strength of the low-k materials, in combination with thinner layers, frequently results in cracking when such materials are subjected to mechanical and thermal stresses. Typical low-k materials in use have included carbon doped silicon dioxide such as commercially available Black Diamond™ and other materials that tend to be porous, thereby reducing the overall dielectric constant. Porous low-k materials have a drawback in that the porosity tends to weaken the overall strength and hardness of the material making crack initiation and propagation more likely. As the requirement for device density increases, the number of levels in an integrated circuit structure has increased to 4 to 10 or more levels. The increased number of material layers contributes to the buildup of compressive and tensile stresses in the multiple layers, especially when subjected to thermal and mechanical stresses, which frequently do not offset one another. The result is that cracking becomes more likely as the number of layers increase and the process wafer is subjected to externally induced stresses that arise when the wafer is cut into the individual dies.

One known approach to alleviate these stresses is to provide crack stop trenches that are located at the die edge to prevent cracking of the die. The crack stop trench also prevents the diffusion of moisture into the device and thus it is also sometimes referred to as a moisture block trench or simply a moisture block. The crack stop trenches are generally formed simultaneously with the trenches and vias of the metal interconnects. That is, the same lithographic steps used in forming the interconnects, including patterning, etching of the pattern, removal of the mask, and etching of the interconnect trenches, are generally used to form the crack stop trenches.

The etching of the trenches is typically performed by reactive ion etching. During this process a plasma is generated that gives rise to currents in the trenches as they are being etched. Unfortunately, the currents that are generated can produce voltages that damage the active or passive devices located in the integrated circuit. This damage, so-called plasma-induced damage, degrades the operational characteristics of the resulting device.

Accordingly, it would be desirable to provide a method for reducing plasma-induced damage that can arise during formation of single and dual damascene interconnect structures that employ crack stop trenches.

SUMMARY OF THE INVENTION

In accordance with the present invention, a method of fabricating a semiconductor device begins by forming a lower interconnection dielectric on a substrate and forming at least one active or passive device in the lower interconnection dielectric. An etch stop layer is formed on the lower interconnection dielectric and an interconnect stack layer is formed on the etch stop layer. At least one interconnect trench structure and at least one crack stop trench are etched in the interconnect stack layer while maintaining electrical isolation between the interconnect structure and the crack stop trench.

In accordance with one aspect of the invention at least one electrically isolating region is formed in the lower interconnection dielectric below a location where the crack stop trench is to be etched.

In accordance with another aspect of the invention, the electrically isolating region comprises a gate dielectric layer.

In accordance with another aspect of the invention, the etching is a reactive ion etching process.

In accordance with another aspect of the invention, the substrate is a SOI substrate.

In accordance with another aspect of the invention, the SOI substrate includes a buried oxide layer that serves as an electrically isolating region that facilitates maintenance of the electrical isolation between the interconnect structure and the crack stop trench during etching.

In accordance with another aspect of the invention, the crack stop trench is continuous and surrounds the interconnect stack layer.

In accordance with another aspect of the invention, the interconnect stack layer comprises a low k dielectric material.

In accordance with another aspect of the invention, the low k dielectric material includes an organosilicon material.

In accordance with another aspect of the invention, he etch stop layer is formed of at least one of SiC, SiN, and SiCN.

In accordance with another aspect of the invention, the dielectric material is formed using chemical vapor deposition.

In accordance with another aspect of the invention, a capping layer is formed on the interconnect stack layer In accordance with another aspect of the invention, the capping layer is formed of at least one of $SiO_2$, SiOF, SiON, SiC, SiN and SiCN.

In accordance with another aspect of the invention, a semiconductor wafer is provided. The wafer includes a lower interconnection dielectric located on a substrate, at least one active or passive device formed in the lower interconnection dielectric and at least one electrical isolating region formed in the lower interconnection dielectric. An etch stop layer is located over the lower interconnection dielectric and an interconnect stack layer is located over on the etch stop layer. At least one interconnect trench structure is located in the interconnect stack layer at least one crack stop trench is located in the interconnect stack layer over the electrical isolating region.

In accordance with another aspect of the invention, the crack stop trenches are continuous and extend around a periphery of an individual die area.

DETAILED DESCRIPTION

The methods and structures described herein do not form a complete process for manufacturing semiconductor device structures. The remainder of the process is known to those of ordinary skill in the art and, therefore, only the process steps and structures necessary to understand the present invention are described herein.

The present invention can be applied to microelectronic devices, such as highly integrated circuit semiconductor devices, processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

Herein, an opening exposing a lower interconnection is referred to as a via, and a region where interconnections will be formed is referred to as a trench. Hereinafter, the present invention will be described by way of an example of a via-first dual damascene process. However the present invention is also applicable to other dual damascene processes as well.

As detailed below, plasma-induced damage to active or passive devices incorporated in microelectronic devices can be avoided or substantially reduced by electrically isolating the crack stop trenches from the conductive interconnect structures during the etching process.

Figure 1:
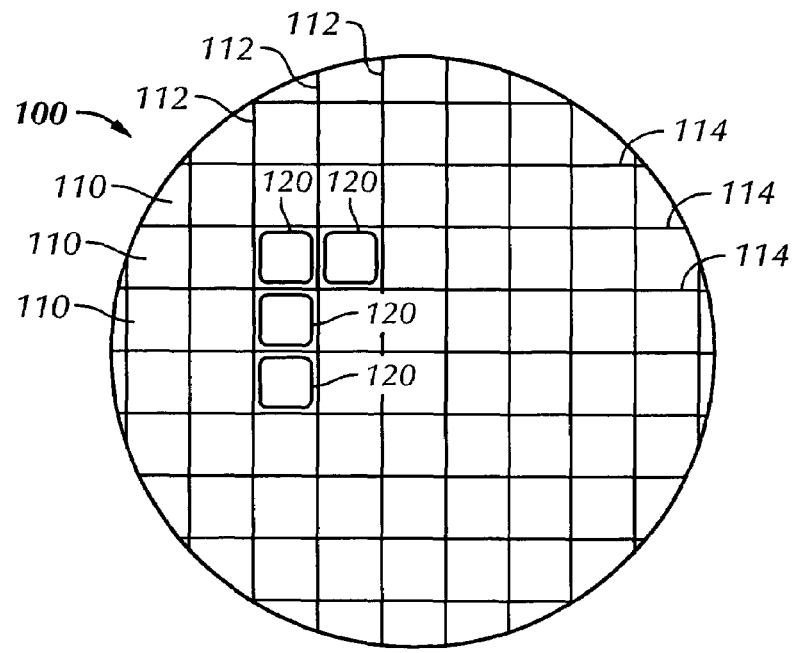
FIG. 1 shows a plan view of a conventional semiconductor wafer.

FIG. 1 shows a plan view of semiconductor wafer 100 in accordance with the present invention, which includes multiple dies 110. The individual dies, which each contain a distinct integrated circuit, are separated from one another along scribe lines 112 and 114, typically by a mechanical process using a saw blade or by a non-contact process such as with a laser. One or more crack stop trenches 120 are formed around the periphery of each die 10 to prevent cracking of the die during the separation process.

Figure 2:
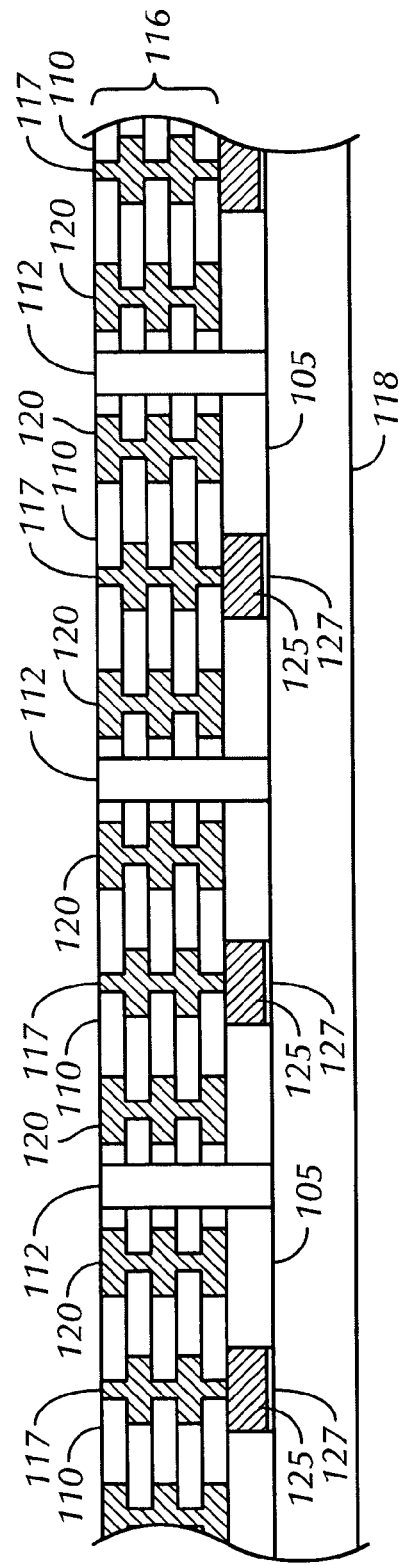
FIG. 2 shows a partial cross-sectional view through semiconductor wafer of FIG. 1.

FIG. 2 shows a partial cross-sectional view through semiconductor wafer 100. As shown, a lower interconnection dielectric 105 (e.g., SiO2) is provided in which various active and passive devices are formed. For example, a gate 125 and gate dielectric 127 of one such active device is shown in FIG. 1 for purposes of illustration. An interconnect stack layer 116 is located on top of substrate 118. Stack layer 116 includes multiple layers of dielectric material and interconnecting electrical conductive structures such as the aforementioned trenches and vias. For example, conductive interconnect structures 117 are shown in stack layer 116. Also shown in FIG. 2 are crack stop trenches 120 located at the periphery of the individual dies 110, adjacent to the scribe lines 112 and 114 seen in FIG. 1. The interconnecting electrically conductive structures 117 are filled with metal (e.g., copper, aluminum, silver, gold) and electrically couple semiconductor devices (not shown) that are formed in substrate 118. The multiple layers of interconnect stack layer 116 are generally formed by a dual damascene process.

As previously mentioned, the crack stop trenches 120 are generally formed simultaneously with conductive interconnects 117. That is, the same lithographic steps used in forming the conductive interconnects 117, including patterning, etching of the pattern, removal of the mask, and reactive ion etching, are generally used to form the crack stop trenches 120.

In reactive ion etching, an electric field is applied to a relatively inert molecular gas so that a reactive gas and chemically reactive species are produced. The atoms on a surface portion of the material not covered by a mask are chemically and physically removed by the resulting plasma beam. Material not covered by the mask is removed to a depth that is determined by a variety of factors including the length of time over which the plasma is applied. In this way well-defined features can be transferred from the mask to the material. During the reactive ion etching process, chemically active species such as ions and radicals of the reactive gas generated in the plasma are adsorbed on the surface of the material. The ions and radicals chemically react with the material and a surface reactive layer is generated that has a relatively low bond energy. Cations that are accelerated by the electric field in the plasma impact the surface of the material, and thus the surface reactive layer, which now has a relatively low bond energy, is removed by sputtering and/or evaporation. That is, reactive ion etching simultaneously employs both chemical action and physical action. As a result, reactive ion etching is selective with respect to particular materials.

One problem that can arise with the use of reactive ion etching is sometimes referred to as RIE lag. RIE lag prevents the achievement of dimensional uniformity after the etching process. RIE lag is believed to occur because etching rates and profiles depend on feature size and pattern density. For instance, one cause of RIE is believed to be aspect ratio dependent etching, which occurs because trench openings with a large aspect ratio etch more slowly than trench openings with a small aspect ratio.

As is evident from FIG. 1, the aspect ratio of crack stops are generally smaller than the aspect ratio of an interconnect formed in the same structure. This is because crack stops are generally defined by lines (which gives rise to a large feature width and hence a small aspect ratio) whereas interconnects are generally defined by relatively small holes or vias (which gives rise to a small feature width and hence a large aspect ratio). Accordingly, because of RIE lag, the etch rate of the crack stop is greater than the etch rate of the interconnect.

Figure 3:
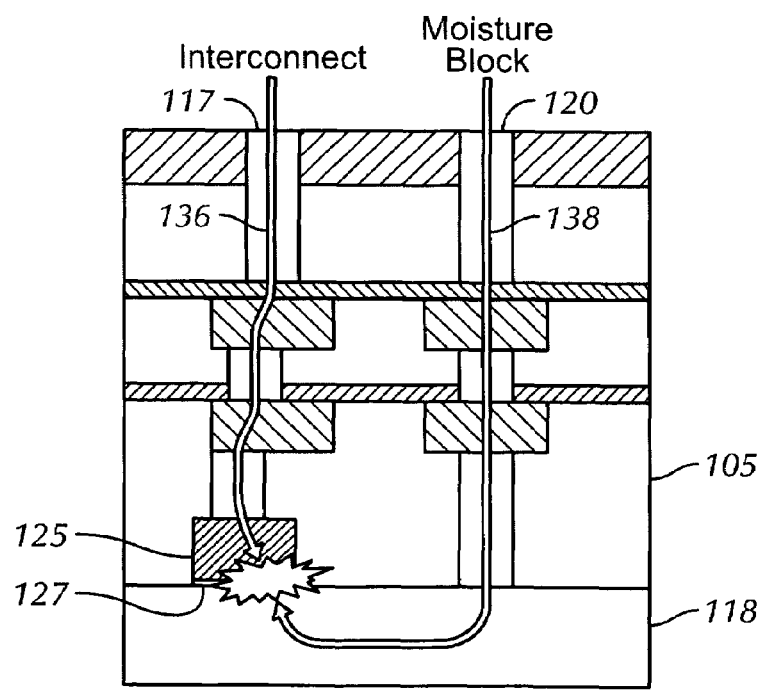
FIG. 3 shows another partial cross-sectional view through semiconductor wafer of FIG. 1 to illustrate plasma induced damage that can arise during reactive ion etching.

The RIE lag between a crack stop and an interconnect may cause process or plasma induced damage by charging the components (e.g., gates) of the active devices formed in the lower interconnection 105, thereby degrading the electrical properties of the components. This damages the active device, degrades its operating characteristics and shortens its useful life. The mechanism by which RIE lag causes plasma induced damage is illustrated with reference to FIG. 3, which for simplicity shows a single crack stop 120 and a single interconnect 117 adjacent thereto. FIG. 3 shows the crack stop 120 and conductive interconnect 117 in the process of being etched. The current flow arising from the etch plasma in the crack stop 120 and the interconnect 117 is represented by lines designated by reference numerals 138 and 136, respectively. Because of the crack stop's 120 greater etching rate, the current that develops through the depth of the crack stop 120 is greater than the current that develops through the depth of the conductive interconnect 117. As a result of this differential in current, a voltage develops on the gate dielectric 127. This voltage is the direct cause of the plasma induced damage.

Figure 4:
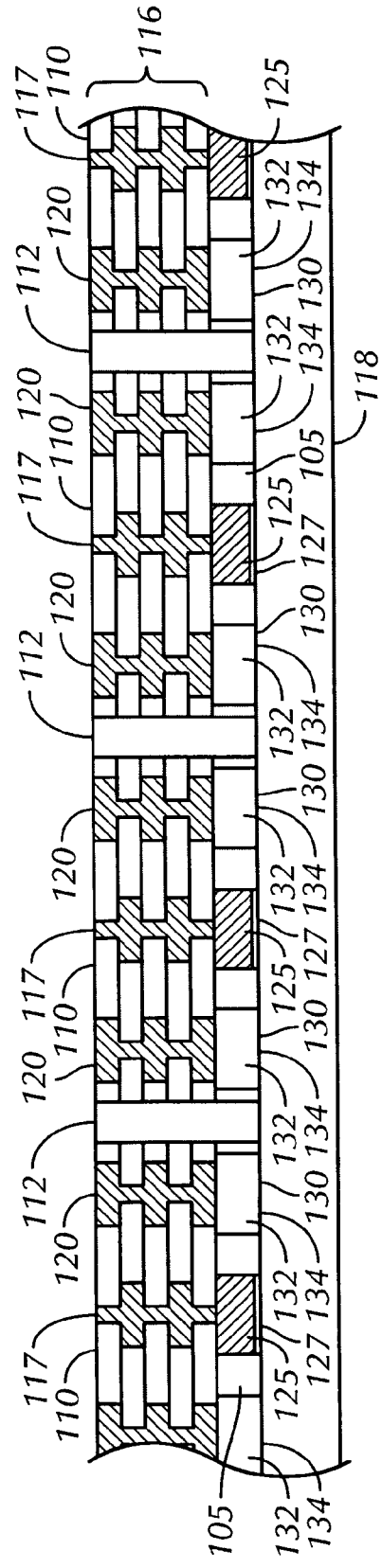
FIGS. 4-6 show various partial cross-sectional views through a semiconductor wafer constructed in accordance with the present invention.
Figure 5:
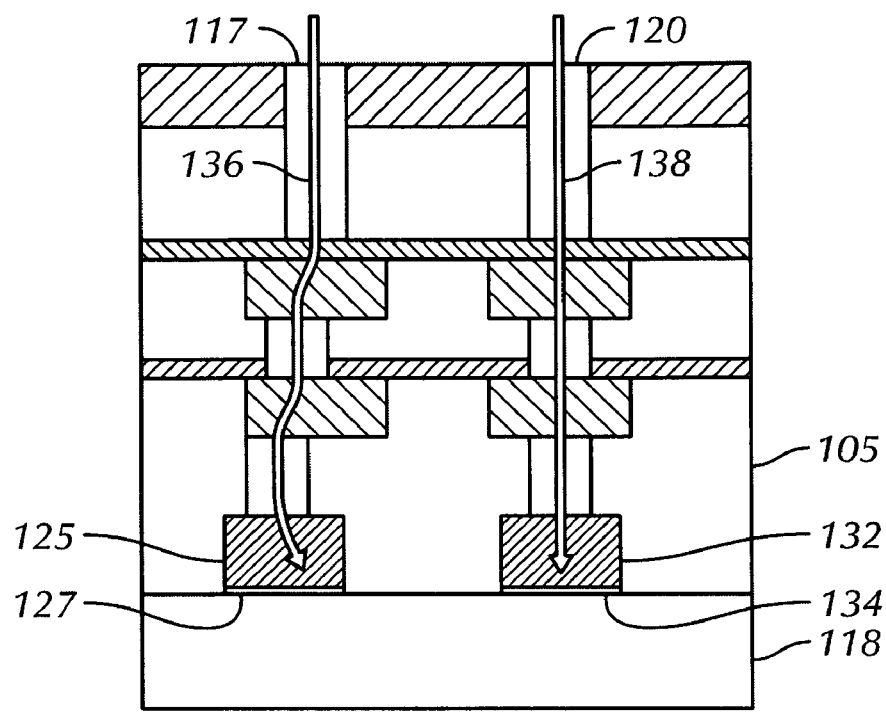

In accordance with the present invention, process or plasma induced damage that arises during reactive ion etching of the trenches for an interconnect and a crack stop is reduced or eliminated by electrically isolating the crack stop. FIGS. 4 and 5 show a cross-sectional view through one example of a semiconductor wafer constructed in accordance with the present invention. In the figures like elements are denoted by like reference numerals. As shown, an electrically isolating region 130 is provided in the lower interconnect 105. The isolating region 130 is situated directly below the crack stop 120 so that it makes contact therewith. The electrical isolating region 130 prevents the current that arises from etching the crack stop from penetrating across the substrate 118 to the gate dielectric 125. In this way the voltage buildup on the gate 125 that causes plasma induced damage is avoided. The RIE process terminates before the electrically isolating region 130 itself is etched.

The electrical isolating region 130 may be any region that has a sufficient dielectric constant to prevent the plasma current from extending into the substrate 118 by any significant amount sufficient to cause plasma induced damage. In the example shown in FIGS. 4 and 5, the electrical isolating region 130 is configured as a polysilicon gate 132 with a gate dielectric 134. That is, the electrical isolating region 130 is largely similar to the gates 125 and gate dielectrics 127 of the active devices formed in the lower interconnection dielectric 105. This simplifies processing of the structure since the gate 132 and gate dielectric 134 can be formed in the same processing steps as the gate 125 and gate dielectric 127 of the active device. Of course, the present invention encompasses the use of any structure formed from any suitable material to serve as the electrical isolating region 130 provided that it reduces or eliminates plasma induced damage.

Figure 6:
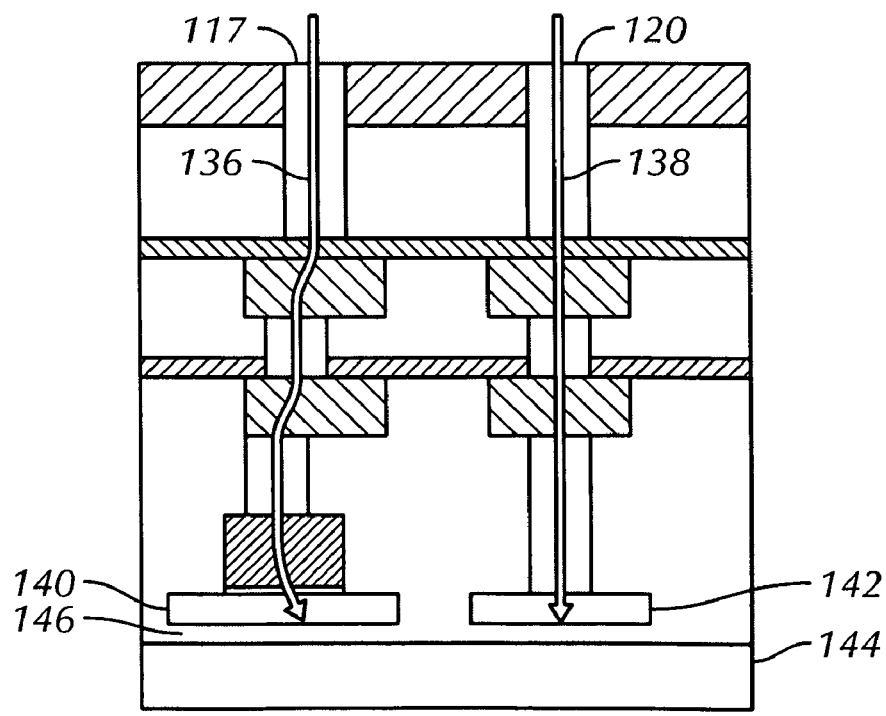

FIG. 6 shows one alternative embodiment of the invention in which the substrate 118 shown in FIGS. 2-5 is replaced with a composite substrate such as a so-called silicon-on-insulator substrate 140. Silicon on-insulator (SOI) substrates or wafers comprise two silicon layers, one of which is thinner than the other, separated by a silicon oxide layer. One method of producing an SOI structure, known by the acronym SIMOX (separation by implanted oxygen) forms a buried oxide layer (BOX) in a semiconductor substrate by implanting oxygen ions into the substrate followed by a high temperature annealing step. The insulating layer provides electrical isolation of devices that are built in the superficial silicon layer.

In FIG. 6 SOI substrate 140 includes an Si layer 142 having a thickness, for instance, of between about 20-70 angstroms. The Si layer 142 is formed on a buried oxide ("BOX") layer 146. Box layers are generally employed as isolation structures to electrically isolate semiconductor devices from one another. BOX layer 146 is formed on the surface of a silicon support substrate or wafer 144. As FIG. 6 shows, the crack stop 120 terminates on Si layer 142. In this way the crack stop 120 is electrically isolated from the interconnects 117 by the BOX layer 146.

A method of fabricating dual damascene interconnections according to an embodiment of the present invention will now be described with reference to FIG. 7 through 14. For purposes of illustration only and not as a limitation on the invention, only a single die is shown in FIGS. 7-13. Of course, more generally, the present invention encompasses wafers that include multiple dies that need to be separated from one another after fabrication. Likewise, only a single interconnect structure 117 comprising a single trench and via are shown. More generally, of course, each die may include multiple interconnect structures each having multiple trenches and vias that may constitute upwards of, e.g., 4-10 interconnect levels.

Figure 7:
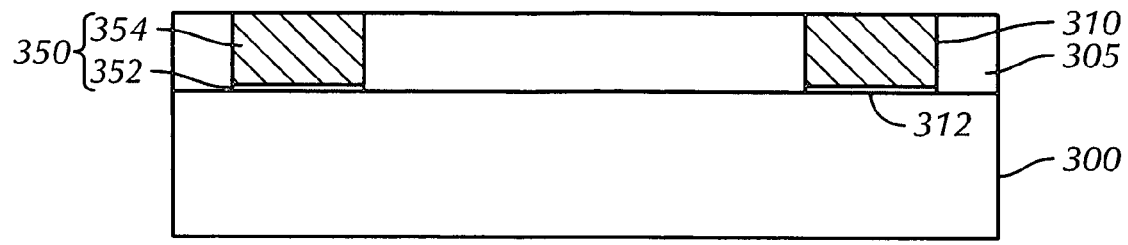
FIGS. 7-13 show the process steps involved in an exemplary process flow used to form a semiconductor wafer in accordance with the present invention.

As shown in FIG. 7, the process begins with the provision of a substrate 300. The substrate 300 may be, for example, a silicon substrate, a silicon on insulator (SOI) substrate, a gallium arsenic substrate, a silicon germanium substrate, a ceramic substrate, a quartz substrate, or a glass substrate for display. Various active devices and passive devices may be formed on the substrate 300. For instance, a lower inter-level dielectric layer (ILD) 305 is formed on the substrate 300 and includes a gate 310 and gate dielectric 312 formed on the substrate 300. An electrical isolating region 350 is also formed on the substrate. In this particular example, the electrical isolating region 350 includes a gate 354 and a gate dielectric 352 that is similar to gate 310 and gate dielectric 312.

Figure 8:
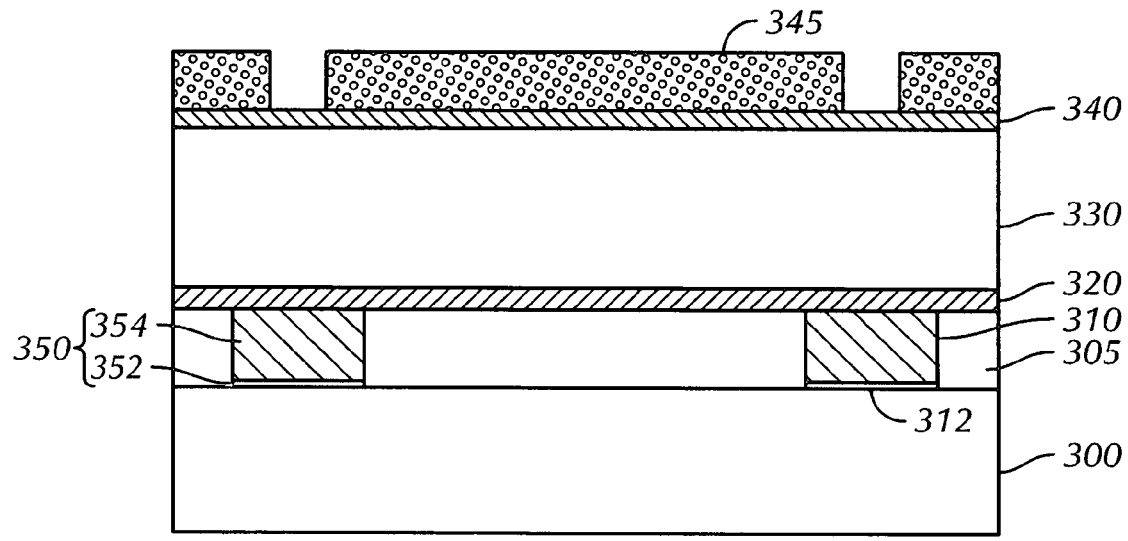

Referring to FIG. 8, an etch stop layer 320, a low-k ILD 330, and a capping layer 340 are sequentially stacked on the surface of the substrate 300, and a photoresist pattern 345 is formed on the capping layer 340 to define a via located over the gate 310 and a crack stop over the electrical isolating region 350.

The etch stop layer 320 is formed to prevent electrical properties of the lower interconnection 310 from being damaged during a subsequent etch process for forming a via and crack stop. Accordingly, the etch stop layer 320 is formed of a material having a high etch selectivity with respect to the ILD 330 formed thereon. Preferably, the etch stop layer 320 is formed of SiC, SiN, or SiCN, having a dielectric constant of 4 to 5. The etch stop layer 320 is as thin as possible in consideration of the dielectric constant of the entire ILD, but thick enough to properly function as an etch stop layer.

The ILD 330 is formed of a hybrid low-k dielectric material, which has advantages of organic and inorganic materials. That is, the ILD 330 is formed of a hybrid low-k dielectric material having low-k characteristics, which can be formed using a conventional apparatus and process, and which is thermally stable. The ILD 330 has a dielectric constant of e.g., 3.5 or less, to prevent an RC delay between the lower interconnection 310 and dual damascene interconnections and minimize cross talk and power consumption. For example, the ILD 330 may be formed from a low-k organosilicon material such as Black Diamond™, Silk™, CORAL™, or a similar material. The ILD 330 can be formed using chemical vapor deposition (CVD), and more specifically, plasma-enhanced CVD (PECVD). The ILD 330 may be also formed from low k materials such as spin-on organics and organo silicates. The ILD 330 is formed to a thickness of about 3,000 angstroms to 20,000 angstroms or other appropriate thicknesses determined by those skilled in the art.

The capping layer 340 prevents the ILD 330 from being damaged when dual damascene interconnections are planarized using chemical mechanical polishing (CMP). Thus, the capping layer 340 may be formed of $SiO_2$, SiOF, SiON, SiC, SiN, or SiCN. The capping layer 340 may also function as an anti-reflection layer (ARL) in a subsequent photolithographic process for forming a trench. In this case the capping layer 340 is more preferably formed of $SiO_2$, SiON, SiC, or SiCN.

Figure 9:
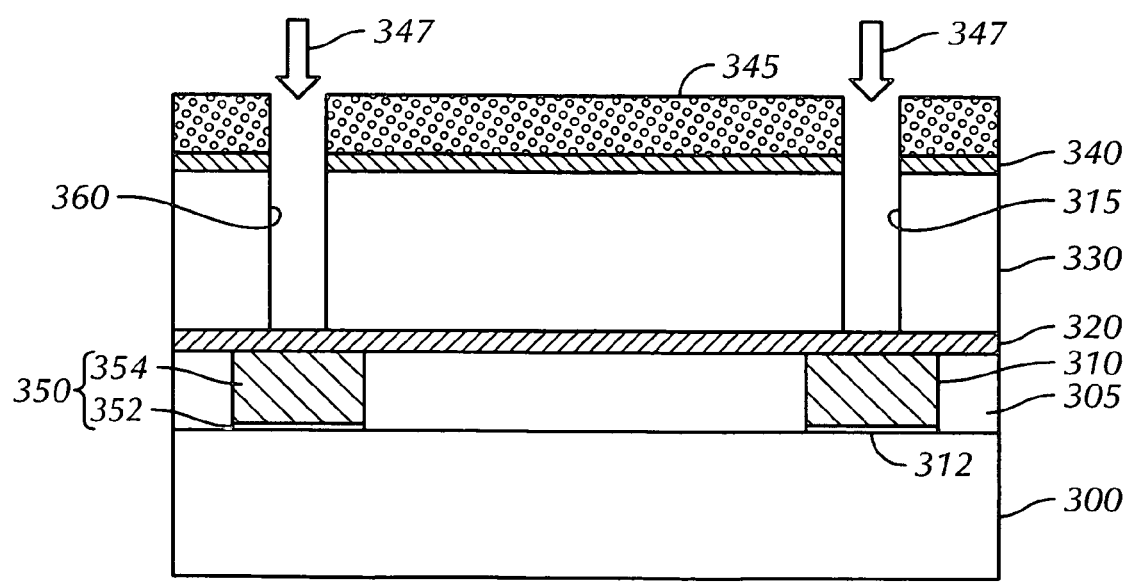

The photoresist pattern 345 is formed by forming a layer of a photoresist and then performing exposure and developing processes using a photo mask to define a via and crack stop. Referring to FIG. 9, the ILD 330 is anisotropically etched (347) using the photoresist pattern 345 as an etch mask to form via 315 and crack stop 360. The ILD 330 can be etched, for example, using a reactive ion beam etch (RIE) process, which uses a mixture of a main etch gas (e.g., $C_xF_y$ and $C_xH_yF_z$), an inert gas (e.g. Ar gas), and possibly at least one of $O_2$, $N_2$, and $CO_x$. Here, the RIE conditions are adjusted such that only the ILD 330 is selectively etched and the etch stop layer 320 is not etched. Because of the provision of electrical isolating region 350, plasma induced damage to gate 310 is substantially reduced or eliminated.

Figure 10:
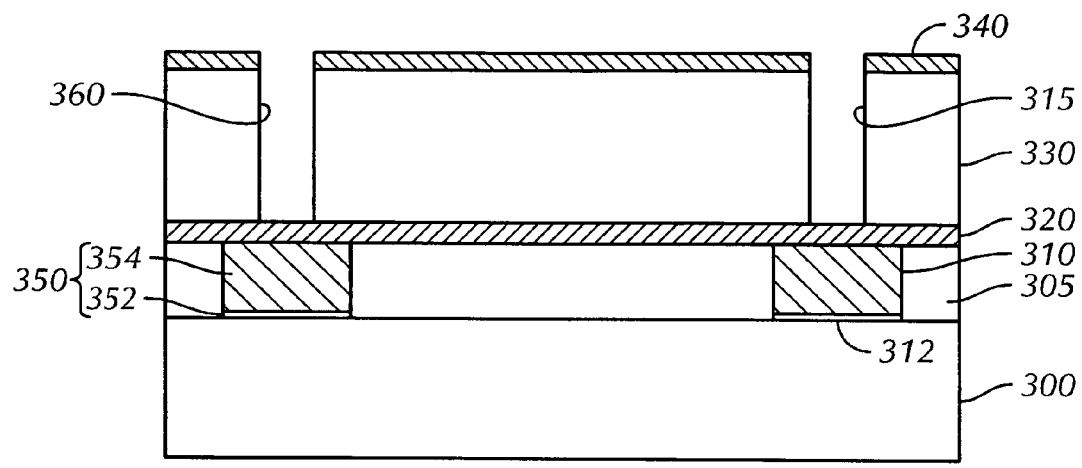
Figure 11:
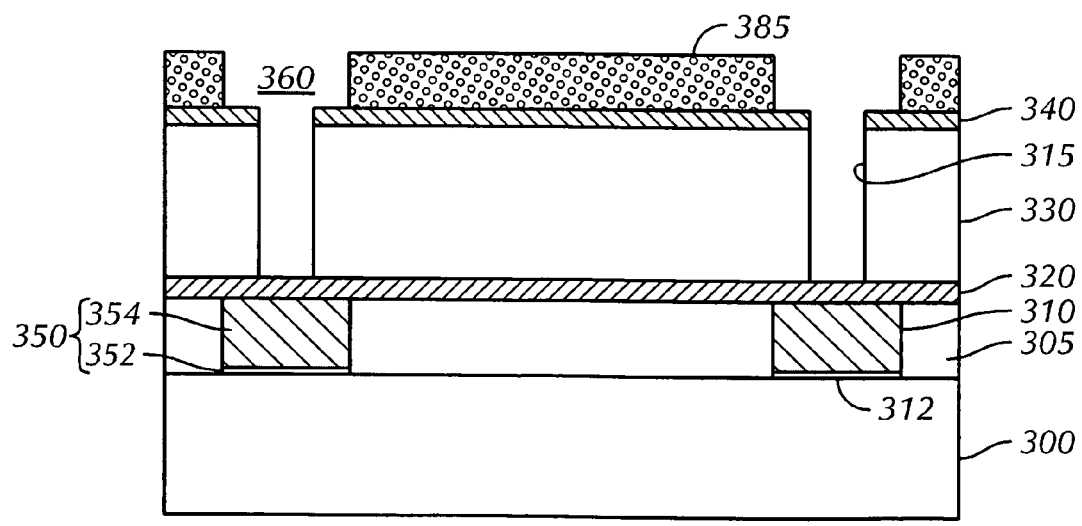
Figure 12:
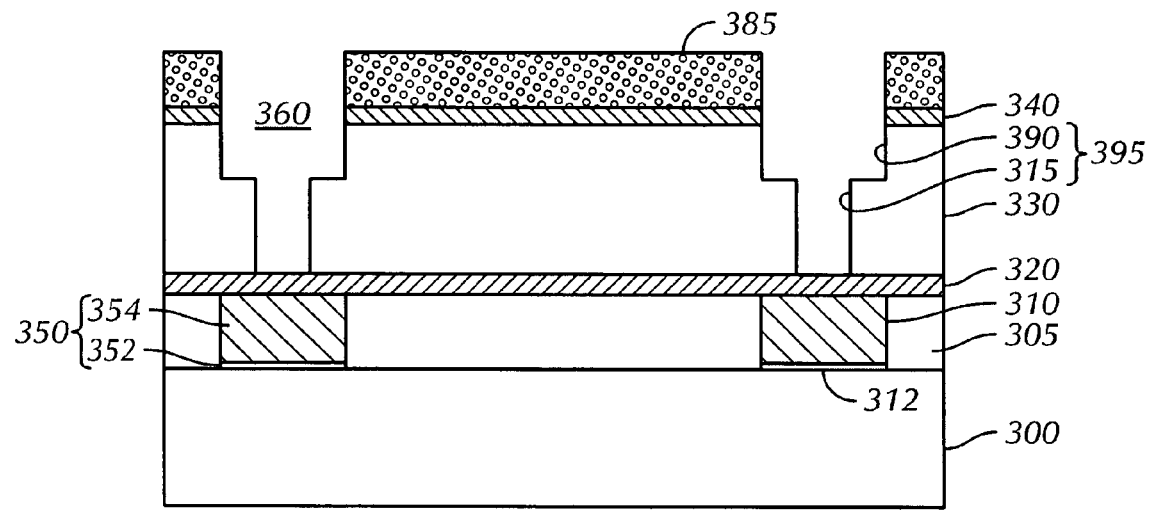

Referring to FIG. 10, the photoresist pattern 345 is removed using a plasma etch, for example. Referring to FIG. 11, a trench photoresist pattern 385 is formed, followed by formation of an interconnect trench 390 in FIG. 12. A trench is also defined in the crack stop 360. The capping layer 340 is etched using the photoresist pattern 385 as an etch mask, and then the ILD 330 is etched to a predetermined depth to form the trenches. The resulting structure, shown in FIG. 12, defines a dual damascene interconnection structure 395, which includes the via 315 and the trench 390 as well as crack stop 360.

Figure 13:
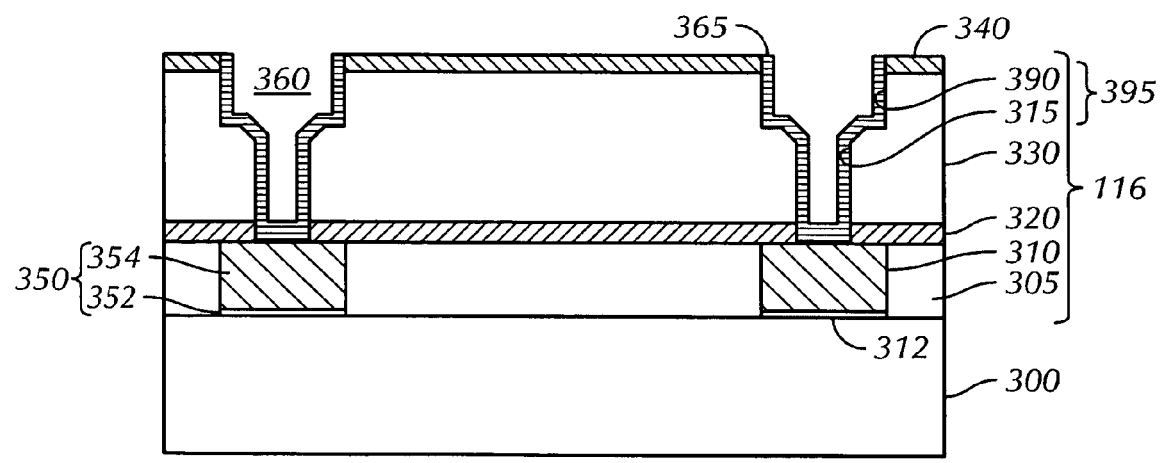

Referring to FIG. 13, the etch stop layer 320 exposed in the via 315 and crack stop 360 is etched until the lower interconnection 310 is exposed, thereby completing the dual damascene interconnection region 395. The etch stop layer 320 is etched so that the lower interconnection 310 is not affected and only the etch stop layer 320 is selectively removed. A barrier layer 360 is formed on the dual damascene interconnection region 395 and the crack stop 360 to prevent the subsequently formed conductive layer from diffusing into ILD 330. The barrier layer 360 is generally formed from a conventional material such as tantalum, tantalum nitride, titanium, titanium silicide or zirconium. After formation of the barrier layer 360 the copper conductive layer is formed on the barrier layer by an electroplating process. The bulk copper layer 365 is formed on the dual damascene interconnection region 395 by electroplating and then planarized, thereby forming a dual damascene interconnection.

Although various embodiments are specifically illustrated and described herein, it will be appreciated that modifications and variations of the present invention are covered by the above teachings and are within the purview of the appended claims without departing from the spirit and intended scope of the invention. For example, those of ordinary skill in the art will recognize that the via-first dual damascene process described with reference to FIGS. 7 through 13 can be applied to a trench-first dual damascene process.

The invention claimed is:

1. A method of fabricating a semiconductor device, the method comprising:
    forming a lower interconnection dielectric on a substrate;
    forming at least one active or passive device in the lower interconnection dielectric;
    forming an etch stop layer on the lower interconnection dielectric;
    forming an interconnect stack layer on the etch stop layer;
    etching in the interconnect stack layer at least one interconnect trench structure and at least one crack stop trench while maintaining electrical isolation between the interconnect structure and the crack stop trench; and
    forming at least one electrically isolating region in the lower interconnection dielectric below a location where the crack stop trench is to be etched,
    wherein the crack stop trench is continuous and surrounds the interconnect stack layer.

2. The method of claim 1 wherein the electrically isolating region comprises a gate dielectric layer.

3. The method of claim 1 wherein the etching is a reactive ion etching process.

4. The method of claim 1 wherein the substrate is a SOI substrate.

5. The method claim 4 wherein the SOI substrate includes a buried oxide layer that serves as an electrically isolating region that facilitates maintenance of the electrical isolation between the interconnect structure and the crack stop trench during etching.

6. The method of claim 1 wherein the interconnect stack layer comprises a low k dielectric material.

7. The method of claim 6 wherein the low k dielectric material includes an organosilicon material.

8. The method of claim 1, wherein the etch stop layer is formed of at least one of SiC, SiN, and SiCN.

9. The method of claim 6, wherein the dielectric material is formed using chemical vapor deposition.

10. The method of claim 1, further comprising forming a capping layer on the interconnect stack layer.

11. The method of claim 10, wherein the capping layer is formed of at least one of $SiO_2$, SiOF, SiON, SiC, SiN and SiCN.

* * * * *

UNITED STATES PATENT AND TRADEMARK OFFICE
CERTIFICATE OF CORRECTION

| | | |
|---|---|---|
| PATENT NO. | : 7,635,650 B2 | Page 1 of 1 |
| APPLICATION NO. | : 11/404738 | |
| DATED | : December 22, 2009 | |
| INVENTOR(S) | : Miyata | |

It is certified that error appears in the above-identified patent and that said Letters Patent is hereby corrected as shown below:

Specification, Col. 3, line 66, after "die", change "10" to -- 110 --.

Signed and Sealed this

Twenty-seventh Day of April, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,635,650 B2 |
| APPLICATION NO. | : 11/404738 |
| DATED | : December 22, 2009 |
| INVENTOR(S) | : Koji Miyata |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 541 days.

Signed and Sealed this

Ninth Day of November, 2010

David J. Kappos
*Director of the United States Patent and Trademark Office*